United States Patent [19]

Nowicki

[11] 4,424,101

[45] Jan. 3, 1984

[54] METHOD OF DEPOSITING DOPED REFRACTORY METAL SILICIDES USING DC MAGNETRON/RF DIODE MODE CO-SPUTTERING TECHNIQUES

[75] Inventor: Ronald S. Nowicki, Sunnyvale, Calif.

[73] Assignee: The Perkin-Elmer Corp., Norwalk, Conn.

[21] Appl. No.: 407,227

[22] Filed: Aug. 11, 1982

Related U.S. Application Data

[63] Continuation of Ser. No. 204,411, Nov. 6, 1980, abandoned.

[51] Int. Cl.³ .............................................. C23C 15/00
[52] U.S. Cl. ............................ 204/192 C; 204/192 SP
[58] Field of Search .......... 204/192 C, 192 SP, 192 S, 204/192 P, 192 F

[56] References Cited

U.S. PATENT DOCUMENTS 4,322,453  3/1982  Miller ..................................... 427/89

FOREIGN PATENT DOCUMENTS 868514  4/1971  Canada ............................ 204/192 F
2528216  1/1977  Fed. Rep. of Germany ... 204/192 S

OTHER PUBLICATIONS

E. Kay et al., "Controlled Sputtering Process", *IBM Tech. Disc. Bull.*, vol. 12, p. 1358 (1970).

S. Inoue et al., "Phosphorus Doped Molybdenum Silicide Technology for LSI Applications", *Int'l. Electron Devices Meeting Tech. Dig.* (Wash. DC), 1980, pp. 152-155.

S. P. Murarka et al., "Silicide Formation in Thin Cosputtered (Ti & Si) Films on Polycrystalline Si and $SiO_2$", *J. Appl. Phys.*, vol. 51, pp. 350-356 (1980).

*Primary Examiner*—Aaron Weisstuch
*Attorney, Agent, or Firm*—F. L. Masselle; T. P. Murphy; J. R. Dwyer

[57] ABSTRACT

A method of depositing refractory metal silicides in a sputtering system on one or more substrates in an environment which supports a glow discharge from a pair of targets at an energy level sufficient to co-sputter and deposit the material from the targets onto the substrate(s). The method includes either a RF high voltage to be applied to one of the targets, or a DC voltage in the presence of a magnetic field to be applied to both targets so as to deposit silicon, either doped or pure, and refractory metal, either doped or pure, as the case may be, to provide a thin film of doped refractory metal silicide on the substrate(s).

15 Claims, 1 Drawing Figure

DC MAGNETRON / RF DIODE MODE

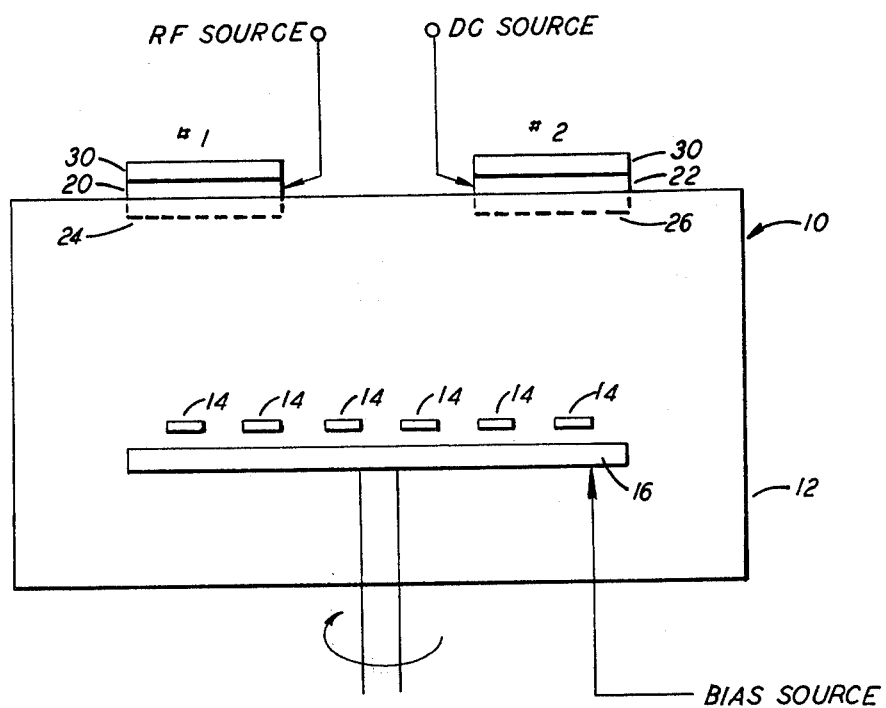
DC MAGNETRON / RF DIODE MODE

METHOD OF DEPOSITING DOPED REFRACTORY METAL SILICIES USING DC MAGNETRON/RF DIODE MODE CO-SPUTTERING TECHNIQUES

RELATED APPLICATION

This application is a continuation of application Ser. No. 204,411, filed Nov. 6, 1980, now abandoned.

The U.S. application for patent entitled "Method of Depositing Refractory Metal Silicides Using RF Diode Co-Sputtering Technique" by R. S. Nowicki, filed Nov. 6, 1980, Ser. No. 204,412, now abandoned.

BACKGROUND OF THE INVENTION

This invention relates in the broadest sense to one of the steps in the process of manufacturing integrated circuits (IC's), and is particularly related to the deposition of refractory metal silicides on oxide or silicon substrates.

The advantages of refractory metal silicides for interconnections and gate electrodes in the manufacture of IC's is known and discussed thoroughly in an article entitled "Refractory Silicides For Integrated Cicuits" by S. P. Murarka in the *Journal of Vacuum Science Technology*, Volume 17, No. 4 (1980) pp 775–792. One method of depositing thin films of molybdenum disilicide ($MoSi_2$) on oxide or silicon substrates by an RF diode co-sputtering technique and its advantages over a DC magnetron single target technique is discussed in the Technical Report No. 80.02 of the Perkin-Elmer Plasma Products Division by R. S. Nowicki and J. F. Moulder, which is a print of a paper submitted to the *Journal of the Electrochemical Society* in May of 1980 and was the subject of a talk at the Society meeting in March of 1980. The disclosure in the talk before the Electrochemical Society in March of 1980 was the first public disclosure of this invention.

In the article by Nowicki et al, it was shown that a film deposited by the co-sputtering technique retained its integrity i.e, did not crack or peel during subsequent heat treatment. The two targets used in the co-sputtering technique were refractory metal and silicon and the reason for using the RF technique rather than the DC technique is due to the difficulty of sputtering pure silicon by the DC technique. This difficulty is well known to those skilled in the art.

In the related application, the method of depositing thin films of molybdenum disilicide ($MoSi_2$) on oxide or silicon substrates by an RF diode co-sputtering technique was disclosed and claimed.

SUMMARY OF THE INVENTION

This invention is an improvement over the RF diode method of the related application. In this invention, where a two target co-sputtering technique is utilized, one of the targets, preferably the silicon target, is doped, i.e., purposely mixed with small concentrations of elements such as phosphorus, boron, arsenic or antimony. The doping of the silicon allows the use of the DC magnetron method since doped silicon is more conductive. This has the additional advantage of increasing the deposition speed since DC magnetron sputtering is faster and more efficient than RF diode sputtering and offers the advantage of producing a doped thin film on the substrate, thus eliminating a doping step in the later process of integrated circuit manufacturing. Another advantage is that the dopant may relieve the stress of the deposited film, thus still further alleviating film degradation in later fabrication steps.

Another aspect of this invention uses the co-sputtering technique in both the RF diode and the DC magnetron modes, thus taking advantage of both modes and involving a pure silicon target, or a doped silicon target, or a pure silicon target, and a doped refractory metal target, so that both may be co-sputtered to provide a doped silicide thin film deposition.

BRIEF DESCRIPTION OF THE DRAWING

The sole FIGURE is a simplified schematic illustration of a sputtering system useful in the practice of this invention in either the RF diode or DC magnetron mode or in the combined RF diode and DC magnetron mode.

BRIEF DESCRIPTION OF THE INVENTION

The drawing illustrates a simplified version of a sputtering system for the purposes of the disclosure of this invention. In this version, the sputtering system 10 comprises a vacuum chamber 12 in which are placed a plurality of wafers 14, or other workpieces, preferably on a rotating table or pallet 16 facing at least two flat coplanar water cooled target electrodes 20 and 22 with their respective target surfaces 24 and 26. These surfaces 24 and 26 contain, or are provided with, the material which is to be sputtered on the wafers 14 and are subjected to a voltage differential between the target and the electrodes and the wafers to support a glow discharge, usually in the presence of argon, as a gaseous environment in the vacuum chamber which is at near vacuum, conventionally $5 \times 10^{-7}$ Torr.

In this embodiment, the electrodes can be subjected to a high voltage, either at DC or at radio frequency (RF=13.56 Mhz), from suitable sources or power supplies sufficient to sputter a dielectric, such as pure silicon, onto the wafers, or to sputter a doped dielectric (conductor) and a refractory metal (conductor) and whether DC or RF voltages are applied, at different voltage levels to the two electrodes, is determined by the two different materials being sputtered. If the material on one of the targets surfaces is a dielectric, an RF voltage is applied to that target while the other target may have either RF or DC type voltages applied thereto as desired. However, if material on one of the targets is a conductor, such as doped silicon, and the other target surface is a refractory metal, doped or undoped, the voltage applied to the target electrodes will be a DC voltage in the presence of a magnetic field, i.e, the DC magnetron mode from, for example, removable or replaceable magnets 30. The use of the DC magnetron technique is preferable because the speed of deposition is faster than the RF diode mode.

Not shown is a rotatable shutter located between the target electrodes and the rotating pallet with openings that are positionable under the active targets for the deposition of the material therefrom onto the wafers that are closest to the target at the time.

In the practice of this invention, the following tabulation will show the type of voltage to be applied to the electrodes for co-deposition depending upon the material used:

| Target 1 | Mode | Target 2 | Mode |
| --- | --- | --- | --- |
| doped Si | DC | refrac metal | DC or RF |

-continued

| Target 1 | Mode | Target 2 | Mode |
|---|---|---|---|
| pure Si | RF | refrac metal | DC or RF |
| doped Si | RF | refrac metal | DC or RF |
| pure Si | RF | doped refrac metal | DC or RF |
| doped Si | DC | doped refrac metal | DC or RF |

In the practice of the foregoing, if doped silicon is used, the typical dopant is arsenic, although other dopants such as phosphorous or antimony may be used, depending upon the device design or configuration. Typically the refractory metal is molybdenum, doped or undoped, although other refractory metals can be used.

The film deposited will be a doped $MoSi_2$ or a doped combination of Mo and Si which will form molybdenum silicide ($MoSi_2$) during a later heating step.

The foregoing method can be practiced with or without a bias voltage supplied to the substrate. It has been found that with a biased substrate −25 to 50 V DC, the heat treated film resistivity is about 20% less than the resistivity of the heat treated film under substrate non-biased conditions, i.e, 87 micro-ohm-centimeter (biased) versus 110 micro-ohm-centimeter resistances (non biased) for the $MoSi_2$ composition.

What is claimed is:

1. A method of sputtering material from a pair of target electrodes onto substrate means, comprising the steps of:
   disposing a pair of target electrodes each having a sputtering surface within a low pressure working gas environment, one of which has a sputtering surface comprising a material doped with a selected dopant;
   applying a DC voltage in the presence of a magnetic field to at least one of said target electrodes; and
   supporting within said gaseous environment said substrate means intended to be sputter coated to thereby coat said substrate means with material from said target electrodes.

2. The method as claimed in claim 1 wherein said doped material is an insulator made conductive.

3. The method as claimed in claim 2 wherein said doped material comprises silicon doped with said dopant, and wherein the other sputtering surface comprises a refractory metal.

4. The method as claimed in claim 3 wherein the DC voltage is applied to the electrode having the silicon surface.

5. The method as claimed in claim 4 wherein the DC voltage is also applied to the electrode having the sputtering surface of refractory metal.

6. The method as claimed in claim 4 wherein the voltage applied to the electrode having the surface of refractory metal is RF.

7. The method as claimed in claim 3 further including the step of applying a bias voltage to said substrate means.

8. The method as claimed in claim 1 wherein the other sputtering surface comprises pure silicon and the voltage applied to the target electrode having said silicon surface is RF.

9. The method as claimed in claim 8 further including the step of applying a bias voltage to said substrate means.

10. The method as claimed in claim 1 wherein said doped sputtering surface comprises doped refractory metal and the other sputtering surface comprises pure silicon and the voltage applied to the doped surface electrode is DC and the voltage applied to the pure silicon surface electrode is RF.

11. The method as claimed in claim 1 wherein said doped sputtering surface is doped silicon and the other of said sputtering surfaces comprises a refractory metal and the voltage applied to both said target electrodes is DC in the presence of a magnetic field.

12. The method as claimed in claim 11 further including the step of applying a bias voltage to said substrate means.

13. A method of co-sputtering material from a pair of target electrodes onto substrate means, comprising the steps of:
   disposing a pair of target electrodes within a low pressure working gas environment,
   providing a sputtering surface of pure silicon on one of said electrodes and applying an RF voltage to said electrode,
   providing a sputtering surface of refractory metal on the other electrode and applying a DC voltage in the presence of a magnetic field thereto, and
   supporting said substrate means within said gaseous environment to thereby coat said substrate means with material from said sputtering surfaces.

14. A method of co-sputtering material from a pair of target electrodes onto substrate means, comprising the steps of:
   disposing a pair of target electrodes with a low pressure working gas environment,
   providing a sputtering surface of doped silicon on one of said electrodes and applying an RF voltage to said electrode,
   providing a sputtering surface of refractory metal on the other electrode and applying either a DC voltage in the presence of a magnetic field or an RF voltage thereto, and
   supporting said substrate means within said gaseous environment to thereby coat said substrate means with material from said sputtering surfaces.

15. A method of co-sputtering material from a pair of target electrodes onto substrate means, comprising the steps of:
   disposing a pair of target electrodes within a low pressure working gas environment,
   providing a sputtering surface of doped silicon on one of said electrodes and applying a DC voltage in the presence of a magnetic field to said electrode,
   providing a sputtering surface of refractory metal on the other electrode and applying either a DC voltage in the presence of a magnetic field or an RF voltage thereto, and
   supporting said substrate means within said gaseous environment to thereby coat said substrate means with material from said sputtering surfaces.

* * * * *

UNITED STATES PATENT AND TRADEMARK OFFICE
CERTIFICATE OF CORRECTION

PATENT NO. : 4,424,101
DATED : January 3, 1984
INVENTOR(S) : Ronald S. Nowicki

It is certified that error appears in the above-identified patent and that said Letters Patent are hereby corrected as shown below:

Column 1, line 24, change "Cicuits"" to --Circuits"--

Column 4, line 37, change "with" to --within--.

Signed and Sealed this

Fourteenth Day of August 1984

[SEAL]

Attest:

GERALD J. MOSSINGHOFF

Attesting Officer    Commissioner of Patents and Trademarks